(12) United States Patent  
Agou

(10) Patent No.: US 7,845,897 B2
(45) Date of Patent: Dec. 7, 2010

(54) METHOD FOR TRANSPORTING SUBSTRATES

(75) Inventor: Kenji Agou, Chigasaki (JP)

(73) Assignee: ULVAC, Inc., Chigasaki-shi (JP)

( * ) Notice: Subject to any disclaimer, the term of this patent is extended or adjusted under 35 U.S.C. 154(b) by 0 days.

(21) Appl. No.: 12/486,238

(22) Filed: Jun. 17, 2009

(65) Prior Publication Data

US 2009/0317226 A1    Dec. 24, 2009

Related U.S. Application Data

(63) Continuation of application No. PCT/JP2008/053141, filed on Feb. 25, 2008.

(30) Foreign Application Priority Data

Jun. 19, 2007    (JP) .............................. 2007-161010

(51) Int. Cl.
    *B65H 1/00*    (2006.01)
(52) U.S. Cl. ................... 414/805; 414/217; 414/744.5; 414/754; 414/936; 414/939
(58) Field of Classification Search ................. 414/217, 414/416.03, 744.5, 754, 784, 936, 939, 941, 414/805
    See application file for complete search history.

(56) References Cited

U.S. PATENT DOCUMENTS

| 5,879,128 | A * | 3/1999 | Tietz et al. .................. 414/757 |
| 6,430,468 | B1 * | 8/2002 | Tepman et al. ............... 700/218 |
| 6,875,306 | B2 * | 4/2005 | Tamura .................. 156/345.24 |
| 7,204,888 | B2 * | 4/2007 | Tran et al. .................... 118/728 |
| 2002/0131848 | A1 * | 9/2002 | Kurata ........................ 414/217 |
| 2004/0045509 | A1 * | 3/2004 | Or et al. ...................... 118/729 |
| 2004/0151574 | A1 * | 8/2004 | Lu .............................. 414/816 |

FOREIGN PATENT DOCUMENTS

| JP | 10-275848 | 10/1998 |
| JP | 10-340940 | 12/1998 |
| JP | 11-163090 | 6/1999 |
| JP | 2002-343844 A1 | 11/2002 |

OTHER PUBLICATIONS

International Search Report for International Application No. PCT/JP2008/053141 dated Mar. 5, 2008.

* cited by examiner

*Primary Examiner*—Michael S Lowe
(74) *Attorney, Agent, or Firm*—Kratz, Quintos & Hanson, LLP

(57) ABSTRACT

Substrates are transported to accurate positions, while mounted on one hand of a transport robot. When substrates are to be transported from transporting chamber into processing chamber, a first mounting portion of a hand is located immediately above first processing position provided in processing chamber; and the substrate placed on first mounting portion is lifted up. Then, a second mounting portion is located immediately above second processing position by finely moving the hand. Next, the substrate on second mounting portion is lifted up. When the hand is pulled out from between the substrates and first and second processing positions and the substrates are lowered, the substrates are accurately arranged on first and second processing positions. When substrates are mounted on the hand in an order reverse to the above, the substrates in processing chamber can be accurately mounted on first and second mounting portions and be carried out.

4 Claims, 6 Drawing Sheets

METHOD FOR TRANSPORTING SUBSTRATES

The present invention is a Continuation of International Application No. PCT/JP2008/053141 filed Feb. 25, 2008, which claims priority to Japan Patent Document No. 2007-161010, filed on Jun. 19, 2007. The entire disclosures of the prior applications are hereby incorporated by reference herein in their entireties.

TECHNICAL FIELD

The present invention generally relates to a method for transporting substrates, and more particularly, to a method for transporting a plurality of the substrates together.

BACKGROUND ART

Recently, transport robots of a plural substrate-transporting type, in which plural substrates can be transported at the same time, have been developed to raise a processing speed.

FIG. 5 is a plan view for illustrating the content of the prior art in the substrate-transporting method. In the transport robot 10 depicted in this figure, one end of an extendable arm portion 20 is attached to rotary shafts 12a, 12b; and a hand 25 is provided at the other end. The hand 25 possesses first and second mounting portions 15a, 15b; and the first and second mounting portions 15a, 15b are configured such that substrates 16a, 16b may be placed on each of the mounting portions one by one.

When the rotary shafts 12a, 12b and a base 11, on which the rotary shafts 12a, 12b are mounted, rotate, the hand 25 linearly and rotationally moves.

This transport robot 10 is disposed inside a transport chamber 51 of a vacuum processing apparatus 50 of a multi-chamber type as shown in FIG. 6; and the hand 25 on which the substrates are placed is inserted into a processing chamber $54_2$ connected to the transporting chamber 51; and the substrates are placed inside the processing chamber $54_2$.

After a vacuum processing (such as, a thin film formation or the like) inside the processing chamber $54_2$, the hand 25 is inserted into the processing chamber $54_2$; and the substrates are carried out, while placed on the hand 25.

Positions, inside the processing chambers $54_1$, $54_2$, at which the substrates are to be placed, are fixed; and when these positions are taken as first and second processing positions 8a, 8b, the substrates 16a, 16b on the first and second mounting portions 15a, 15b need to be accurately arranged on the first and second processing positions 8a, 8b, respectively.

However, even though either one of the first and second mounting portions 15a, 15b can be aligned to the corresponding processing position 8a, 8b, the distance between the first and second processing portions 8a, 8b and the orientations thereof cannot be completely in conformity with the distance between the first and second mounting portions 15a, 15b and the orientations thereof, due to placement errors or the like. Consequently, both of the first and second mounting portions 15a, 15b cannot be simultaneously aligned to the first and second processing positions 8a, 8b.

FIG. 5 shows a case where angles $\theta_1$, $\theta_2$ ($\theta_1=\theta_2$) formed between a linearly moving direction V of the hand 25 and a line segment F1 connecting center points Pa, Pb of the first and second mounting portions 15a, 15b are not equal, by a placement error, to angles $\phi_1$, $\phi_2$ ($\phi_1=\phi_2$) formed between the linearly moving direction V of the hand 25 and a line segment F2 connecting center points Qa, Qb of the first and second processing portions 8a, 8b. If there is such a placement error, the substrates 16a, 16b on the first and second mounting portions 15a, 15b cannot be accurately placed on the first and second processing positions 8a, 8b at the same time simply by moving the hand 25 through extending or shortening the arm portion 20 and rotating the base 11.

A transport robot is, for example, described in the following document. See No. JP-A 10-275848.

DISCLOSURE OF THE INVENTION

Problem to be Solved by the Invention

An object of the present invention is to accurately arrange a plurality of substrates placed on the above-described hand onto processing positions.

Measures to Solve the Problem

In order to solve the above problem, the present invention is directed to a method for transporting substrates, which includes steps of providing a hand of a transport robot with first and second mounting portions, placing the substrates on the first and second mounting portions, respectively, moving the hand into a processing chamber, and placing the substrates on first and second processing positions set inside the processing chamber, wherein the first mounting portion is located above the first processing position, and in a state in which the substrate placed on the first mounting portion is lifted by a first lift-up mechanism, the second mounting portion is located above the second processing position by moving the hand.

Further, the present invention is directed to the substrate transporting method, wherein after the substrate placed on the second mounting portion located above the second processing position is lifted from the second mounting portion by a second lift-up mechanism, the first and second mounting portions are retracted from the first and second processing positions, and then the substrates above the first and second processing positions are lowered and arranged on the first and second processing positions.

Furthermore, the present invention is directed to the substrate transporting method, wherein the hand is moved by either one or both of a rotational movement around one vertical rotary axis and a linear movement along a line extending in a radial direction crossing vertically with the rotary axis.

In addition, the present invention is directed to the substrate transporting method, wherein the first and second mounting portions are formed in a two-forked shape; the substrate placed on the first mounting portion is mounted on a first supporting member inserted from beneath into a cut portion in the forked shape; and the hand is moved in a state such that the first supporting member is kept inserted in the cut portion.

Effect of the Invention

Plural substrates on the hand of a transport robot can be arranged accurately on processing positions.

BEST MODE FOR CARRYING OUT THE INVENTION

Figure 1:
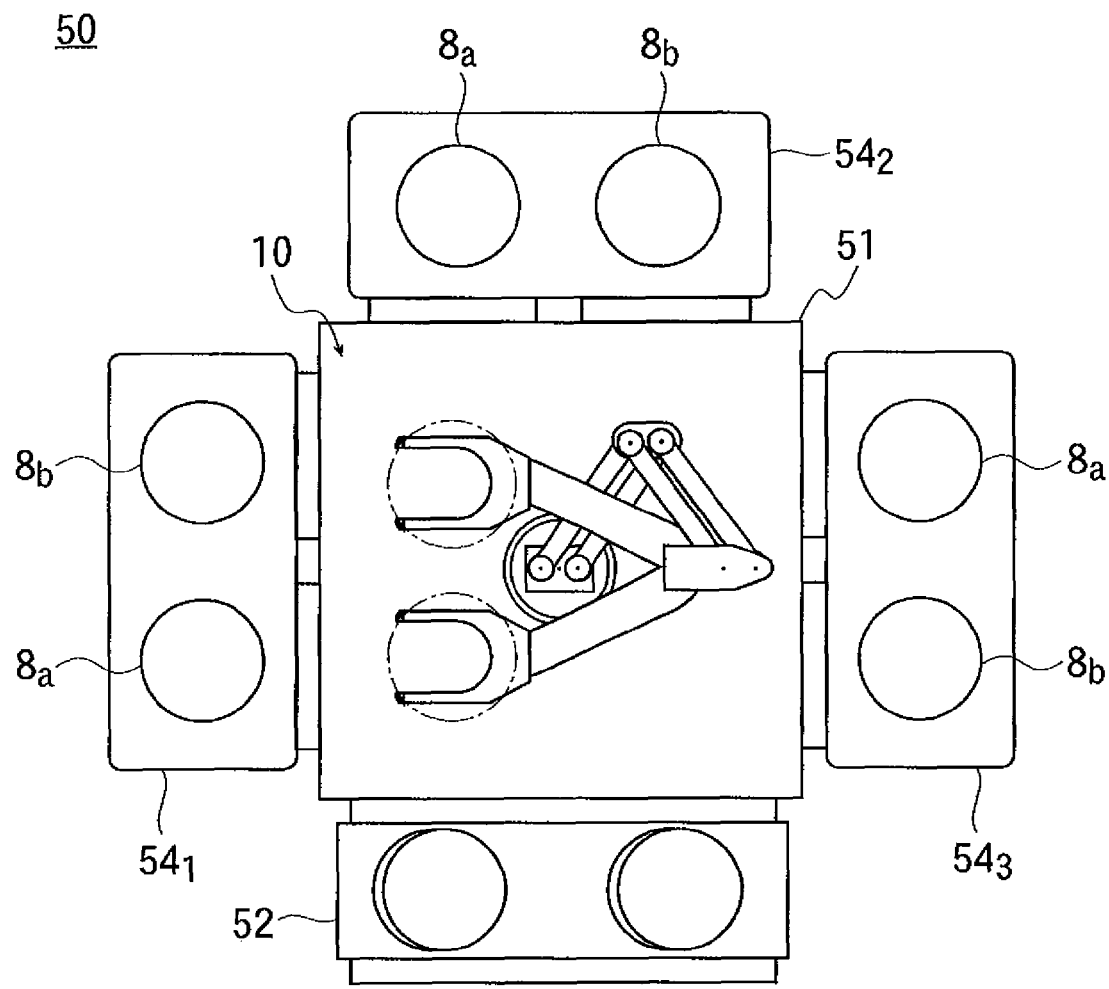
FIG. 1 is a schematically plan view for illustrating an embodiment of a vacuum processing apparatus to which the present invention is applicable.

In FIG. 1, a reference numeral 50 denotes a vacuum processing apparatus in which a transport robot is arranged and is capable of using the transporting method of the present invention. This vacuum processing apparatus 50 comprises a transporting chamber 51, a carrying-in-and-out chamber 52, and a plurality of processing chambers $54_1$ to $54_3$. The carrying-in-and-out chamber 52 and the processing chambers $54_1$ to $54_3$ are arranged around the transporting chamber 51, and their interiors are connected to the interior of the transporting chamber 51.

A transport robot 10 is disposed inside the transporting chamber 51.

Figure 2:
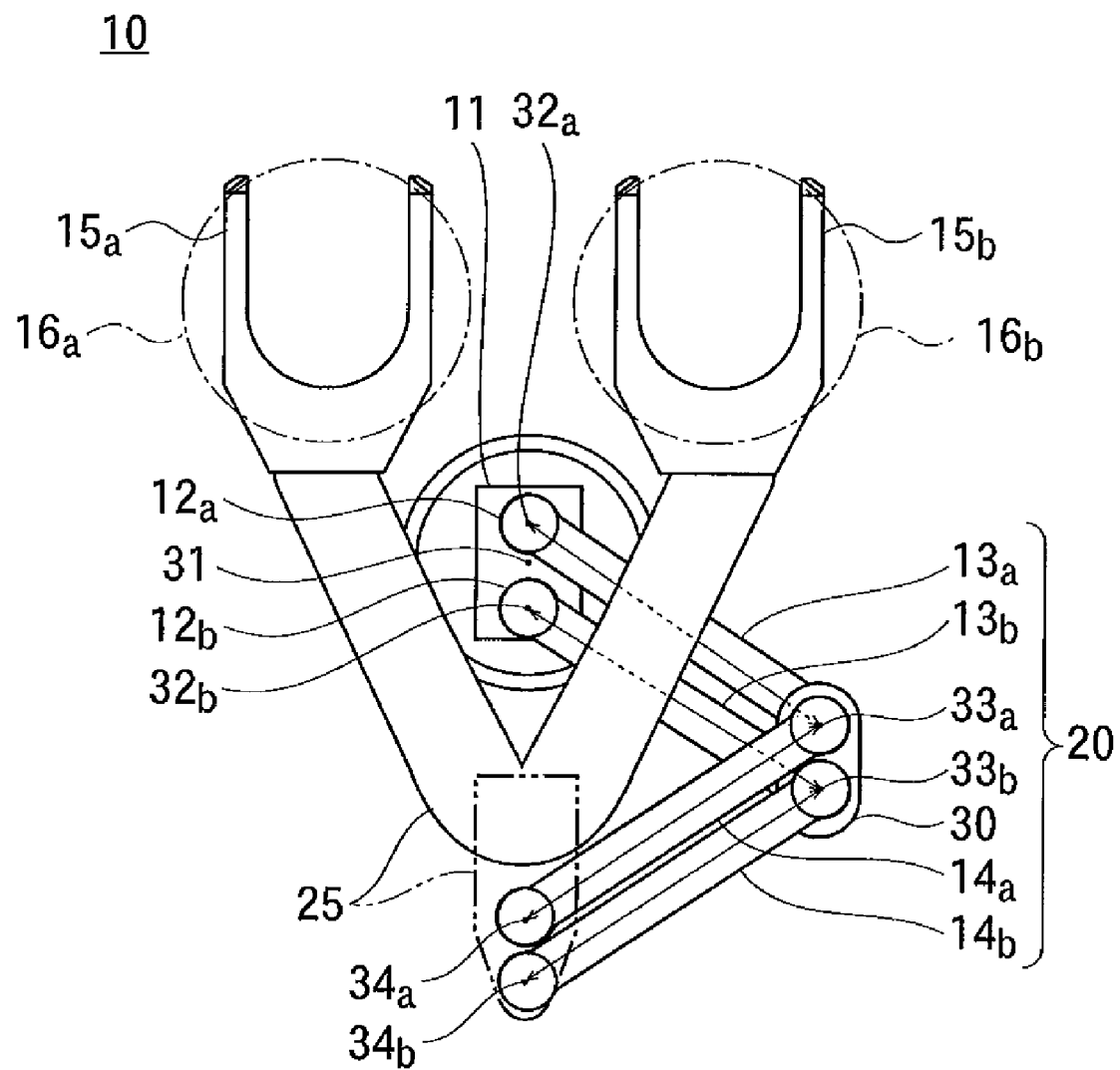
FIG. 2 is a plan view of a transport robot in a state such that an arm portion is shortened.
Figure 3:
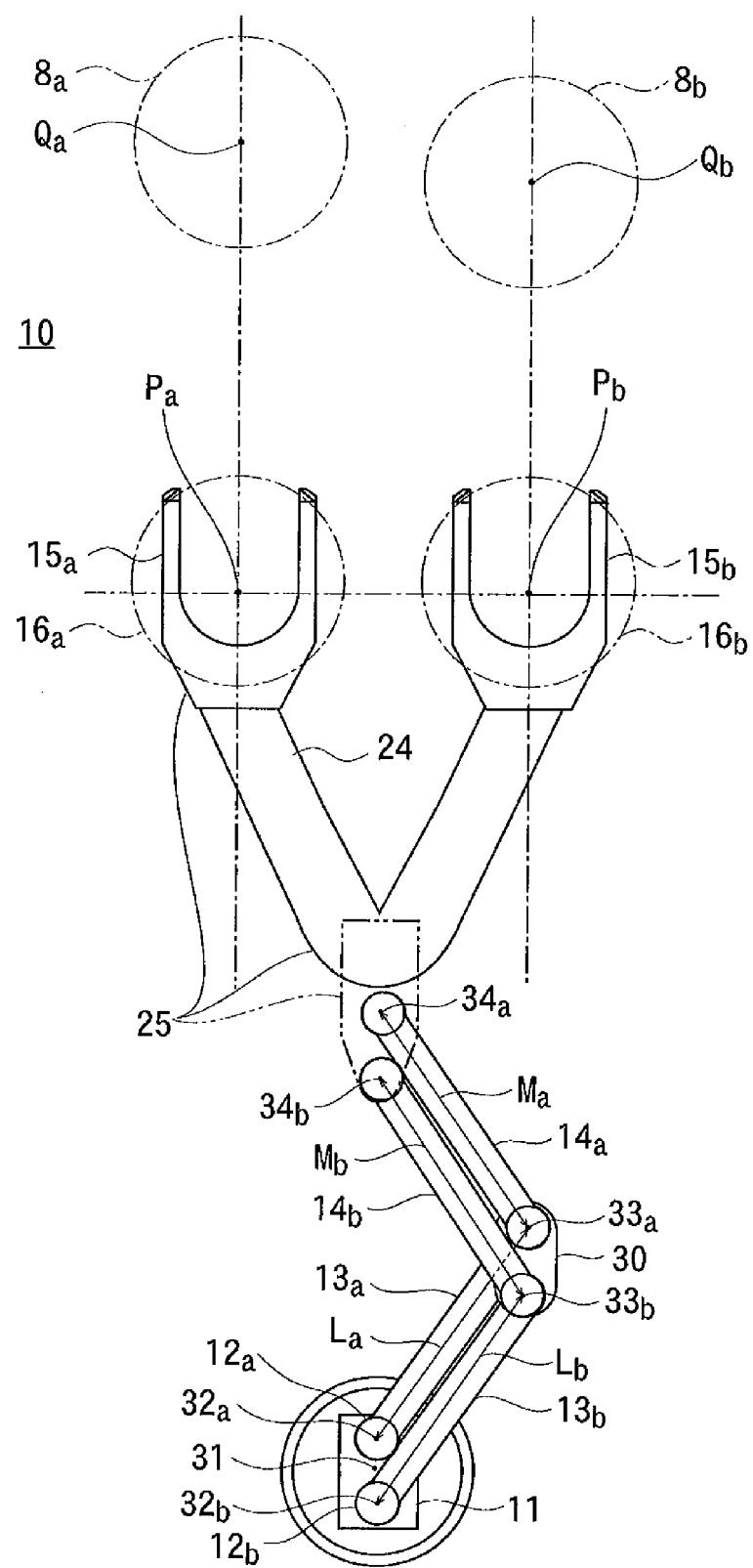
FIG. 3 is a plan view of the transport robot in a state such that the arm portion is extended.
Figure 5:
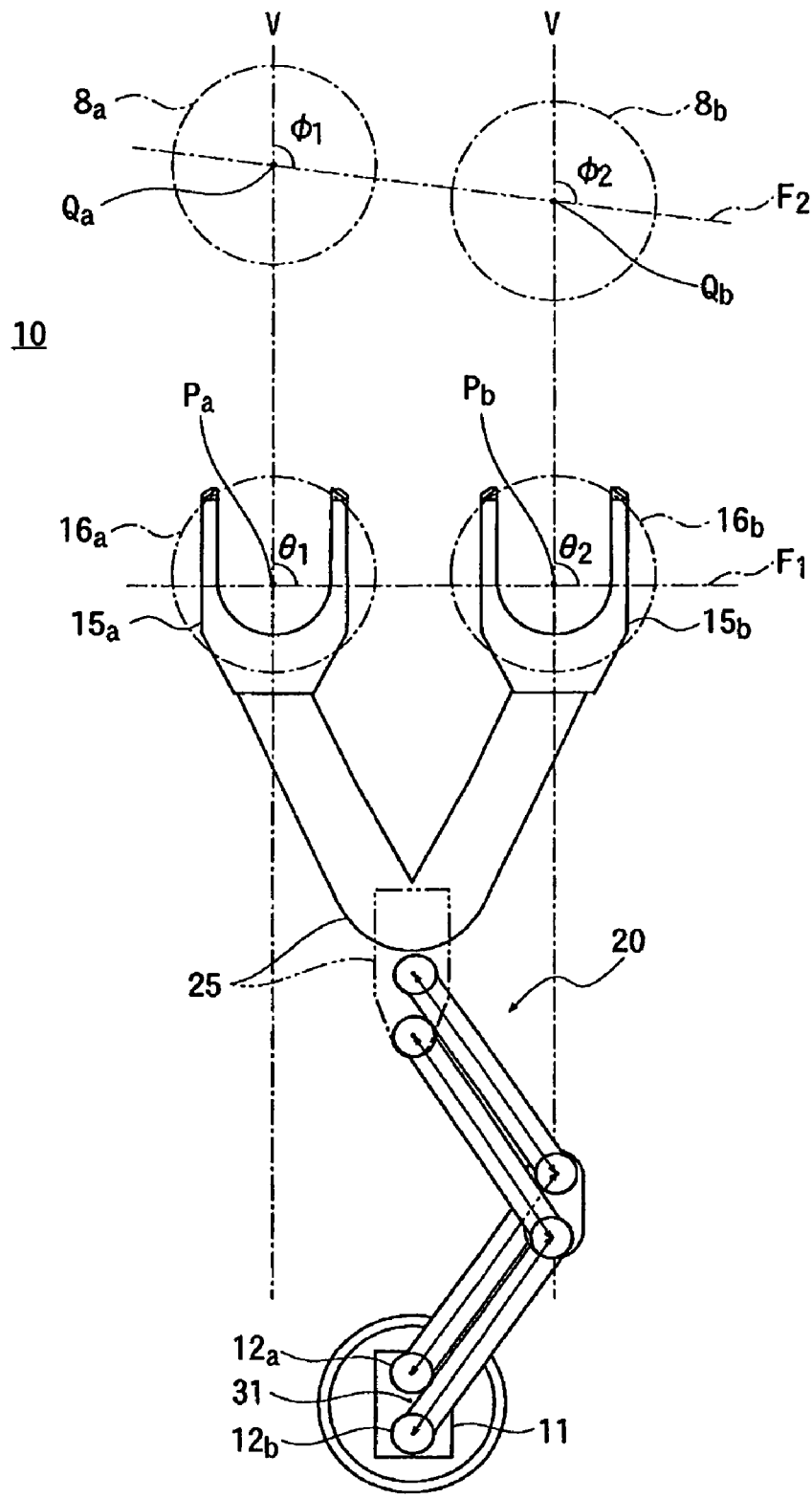
FIG. 5 is a figure for illustrating a substrate-transporting method.
Figure 6:
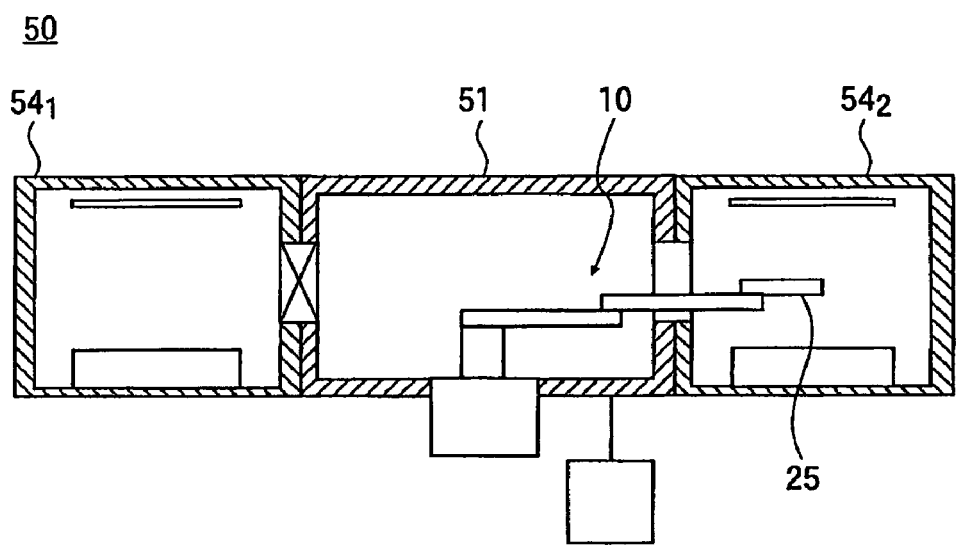
FIG. 6 is a figure for illustrating the transporting method of the prior art.

FIGS. 2 and 3 show plan views of the transport robot 10. The transport robot depicted in FIGS. 2 and 3 is the same as that depicted in FIG. 5.

The transport robot 10 comprises a base (a primary rotary shaft) 11, first and second auxiliary rotary shafts 12a, 12b, an arm portion 20 and a hand 25.

The base 11 and the first and second auxiliary rotary shafts 12a, 12b are respectively connected to driving units (such as motors); and the base 11 is configured such that it can rotate horizontally around a vertical primary rotary axis 31 located in the center of the base 11.

The base 11 is provided with first and second auxiliary rotary shafts 12a and 12b, which are configured such that when the base 11 rotates, they also rotate around the primary rotary axis 31 together with the base 11.

It is configured that central axes of the first and second auxiliary rotary shafts 12a and 12b are vertical, and when these central axes are taken as first and second auxiliary rotary axes 32a, 32b, the first and second auxiliary rotary shafts 12a, 12b rotate around the first and second auxiliary rotary axes 32a, 32b.

The arm portion 20 comprises first and second driving arms 13a, 13b and first and second driven arms 14a, 14b.

Ends of the first and second driving arms 13a, 13b are respectively attached to the first and second auxiliary rotary shafts 12a, 12b; and when the first and second auxiliary rotary shafts 12a, 12b rotate, the first and second driving arms 13a, 13b rotate around the first and second auxiliary rotary axes 32a, 32b.

The first and second auxiliary rotary axes 32a, 32b and the primary rotary axis 31 are parallel to each other, and positioned within the same plane. Further, the first and second auxiliary rotary axes 32a, 32b are positioned at an equal distance from the primary rotary axis 31.

Ends of the first and second driven arms 14a, 14b are rotatably and respectively attached to the other ends of the first and second driving arms 13a, 13b; and the hand 25 is rotatably attached to the other ends of the first and second driven arms 14a, 14b.

In the figures, reference numerals 33a, 33b denote first and second rotating centers of the first and second driven arms 14a, 14b relative to the first and second driving arms 13a, 13b; and reference numerals 34a, 34b denote first and second partially-rotating centers of the hand 25 relative to the first and second driven arms 14a, 14b.

The first and second partially-rotating centers 34a, 34b are stationary relative to the hand 25, so that the distance between the first and second partially-rotating centers 34a, 34b is constant.

Portions, to which the first and second driving arms 13a, 13b and the first and second driven arms 14a, 14b are attached, are inserted into a restraint plate 30, so that the first and second rotating centers 33a, 33b are stationary relative to the restraint plate 30; and the distance between the first and second rotating centers 33a, 33b is also constant.

Horizontal components (La, Lb) of line segments connecting the first and second auxiliary rotary axes 32a, 32b with the first and second rotating centers 33a, 33b and horizontal components (Ma, Mb) of line segments connecting the first and second rotating centers 33a, 33b with the first and second partially-rotating centers 34a, 34b are all set equal in magnitude (La=Lb=Ma=Mb); and the distance in the horizontal direction between the first and second auxiliary rotary axes 32a, 32b, the distance in the horizontal direction between the first and second rotating centers 33a, 33b, and the distance in the horizontal direction between the first and second partially-rotating centers 34a, 34b are parallel to one another and equal to one another in magnitude.

Therefore, the first and second auxiliary rotary shafts 12a, 12b can rotate only in the same direction and at the same angle.

The first and second partially-rotating centers 34a, 34b are positioned in a vertical plane in which the primary rotary axis 31 and the first and second auxiliary rotary axes 32a, 32b are positioned; and the relationships among each other are kept constant even when the first and second auxiliary rotary shafts 12a and 12b rotate and the hand 25 moves. Since the hand 25 is at a constant height and moves within a horizontal plane, when the first and second auxiliary rotary shafts 12a, 12b rotate and the arm portion 20 extends and shortens, the hand 25 moves linearly in parallel to a line crossing vertically with the first and second auxiliary rotary axes 32a, 32b among lines extending radially around the primary rotary axis 31. FIG. 2 shows a state in which the arm portion 20 shortens and the hand 25 moves along the radially extending line and approaches the primary rotary axis 31; and FIG. 3 shows a state in which the hand moves away from the primary rotary axis 31 through a movement in a reverse direction.

The hand 25 is provided with first and second mounting portions 15a, 15b on which substrates 16a, 16b are to be placed. The first and second mounting portions 15a, 15b are fixed to a two-arm plane-like portion 24 possessed by the hand 25; and the first and second mounting portions 15a, 15b are set stationary relative to each other and move together in the same direction.

When the hand 25 moves linearly through the rotation of the first and second auxiliary rotary shafts 12a, 12b, the center points Pa, Pb of the first and second mounting portions 15a, 15b move in a direction toward which the primary rotary axis 31 of the hand 25 as a center extends, and the center points Pa, Pb move in a direction parallel to the radial line crossing vertically with the first and second auxiliary rotary axes 32a, 32b.

Further, the center points Pa, Pb of the first and second mounting portions 15a, 15b rotationally move around the primary rotary axis 31 through the rotation of the base 11.

The first and second mounting portions 15a, 15b are configured such that the center points of the substrates 16a, 16b are positioned vertically above the center points Pa, Pb thereof. When the hand 25 performs the linear movement and the rotational movement in the state such that the substrates 16a, 16b are placed on the first and second mounting portions 15a, 15b, respectively, the substrates 16a, 16b can be transported to desired positions.

The substrates 16a, 16b on the first and second mounting portions 15a, 15b cannot be simultaneously placed accurately on the first and second processing positions 8a, 8b, in a case where, in transferred places, the substrates 16a, 16b on the first and second mounting portions 15a, 15b are respectively to be arranged on first and second processing portions 8a, 8b inside processing chambers $54_1$ to $54_3$; in a case where the horizontal component of the line segment connecting the center points Qa, Qb of the first and second processing positions 8a, 8b is not parallel to the horizontal component of the line segment connecting the center points Pa, Pb of the first and second mounting portions 15a, 15b; in a case where the distance between the center points Qa, Qb of the first and second processing positions 8a, 8b is different from that between the center points Pa, Pb of the first and second mounting portions 15a, 15b; or in a case where the above two cases are combined.

FIGS. 4(a) to (f) are schematic views for illustrating a method in which the substrates 16a, 16b on the first and second mounting portions 15a, 15b are accurately arranged on the first and second processing portions 8a, 8b on a base 46 set inside the processing chambers $54_1$ to $54_3$.

The substrates 16a, 16b are placed on the first and second mounting portions 15a, 15b inside the carrying-in-and-out chamber 52; and the hand 25 is first rotationally moved and linearly moved to transfer either one of the first and second mounting portions 15a, 15b above the corresponding processing position 8a or 8b; and it is immobilized immediately above that processing position 8a or 8b (FIG. 4(a)).

Here, the first mounting portion 15a is moved above the first processing position 8a such that the center point Pa of the first mounting portion 15a is located immediately above the center point Qa of the first processing position 8a. In this state, the center point Pb of the second mounting portion 15b is located at a position which is not positioned immediately above the center point Qb of the second processing position 8b.

First and second lift-up mechanisms 44a, 44b are provided in the first and second processing positions 8a, 8b; and the lift-up mechanism, corresponding to the first processing position 8a, which is located immediately above, of the first and second processing positions 8a, 8b is operated and lifts up the substrate 16a located above the first processing position 8a from the first mounting portion 15a.

Here, the first and second lift-up mechanisms 44a, 44b comprise first and second motors 45a, 45b, bases arranged under the first and second processing positions 8a, 8b, respectively, or first and second supporting members 47a, 47b composed of plural pins; and the first and second supporting members 47a, 47b are configured to be moved up and down by the first and second motors 45a, 45b.

The pins of the first and second supporting members 47a, 47b are inserted into vertical holes 49a, 49b provided in the base 46. (Holes 49a, 49b are shown in FIG. 4(a), but omitted in FIGS. 4(b) to (f).) When the supporting members 47a, 47b are raised, their upper ends protrude upwardly from the surfaces of the first and second processing positions 8a, 8b. When the supporting members 47a, 47b are descended, the upper ends are located under the surfaces of the first and second processing positions 8a, 8b so that the upper ends of the pins can be received inside the holes 49a, 49b.

First and second cut portions are formed in the first and second mounting portions 15a, 15b, respectively, which are formed in a two-forked shape with tip portions thereof opened.

Bottom faces of the substrates 16a, 16b are exposed at the first and second cut portions of the first and second mounting portions 15a, 15b.

When the first supporting member 47a is raised from the underside of the first mounting portion 15a which is located immediately above the center point, the upper end portion of the first supporting member 47a is brought into contact with the bottom face of the substrate 16a. When the first supporting member 47a is further raised, the substrate 16a is lifted up from the first mounting portion 15a ((b) of the same figure).

In this state, the first supporting member 47a is inserted into the cut portion of the first mounting portion 15a.

When the first supporting member 47a is inserted into the first mounting portion 15a, the first supporting member 47a is prevented from contacting with the first mounting portion 15a. It is configured that a gap $L_L$ not less than a minimum distance $L_H$ in a horizontal direction is formed between the outer periphery of the first supporting member 47a and the member of the first mounting portion 15a positioned around the supporting member 47a.

On the other hand, the center point Pb of the second mounting portion 15b is not located immediately above the center point Qb of the corresponding second processing position 8b; and the center points Pb and Qb are away by an error distance $L_E$ in the horizontal direction.

The magnitude of the error distance $L_E$ is preliminarily grasped; and in the present invention, the sizes of the first and second supporting members 47a, 47b and the cut portions of the first and second mounting portions 15a, 15b are formed such that the minimum distance $L_H$ may be greater than the error distance $L_E$ ($L_E < L_H$).

Further, the orientation of the occurring error distance $L_E$ is also preliminarily grasped, and a moving amount and a moving direction of the hand 25 are determined in advance in order to make the error distance $L_E$ zero.

After the substrate 16a is lifted upwardly, by the first supporting member 47a, from the first mounting portion 15a located immediately above the first processing position 8a, the base 11 and the first and second auxiliary rotary shafts 12a, 12b are rotated; and the linear movement and the rotational movement of the hand 25 are combined, and the hand 25 is moved only by a predetermined distance in a predetermined direction. Accordingly, the center point Pb of the second mounting portion 15b is located immediately above the center point Qb of the second processing position 8b ((c) of the same figure).

In this state, the error distance $L_E$ in the horizontal direction is zero. When the second supporting member 47b positioned under the second mounting portion 15b rises, inserted into the cut portion of the second mounting portion 15b, brought into contact with the rear face of the substrate 16b on the second mounting portion 15b and the substrate 16b is lifted up from the second mounting portion 15b, the substrates 16a and 16b transported into the processing chamber by the hand 25 are both lifted up from the hand 25 ((d) of the same figure).

Opening portions of the cut portions of the first and second mounting portions 15a, 15b are located at the radially farthest positions of the first and second mounting portions 15a, 15b.

After the substrates 16a, 16b on the hand 25 are completely lifted as described above, when the arm portion 20 is shortened to linearly move the hand 25 in a direction approaching the primary rotary axis 31, the first and second supporting portions 47a, 47b relatively pass the opening portions of the cut portions of the first and second mounting portions 15a, 15b, so that the first and second mounting portions 15a, 15b are moved from above the first and second processing positions 8a, 8b ((e) of the same figure).

When the first and second supporting portions 47a, 47b are lowered in this state, the substrates 16a, 16b on the first and second supporting portions 47a, 47b are lowered together with the first and second supporting portions 47a, 47b, and arranged on the first and second processing positions 8a, 8b((f) of the same figure).

When the center points of the substrates 16a, 16b are located on vertical lines passing the center points Pa, Pb of the first and second mounting portions 15a, 15b, the center points of the substrates 16a, 16b are located on the vertical lines passing the center points Qa, Qb of the first and second processing positions 8a, 8b.

The above explanation has been directed to the transport robot in which the first and second auxiliary rotary shafts are positioned away from each other, but the invention is also applicable to a transport robot in which first and second auxiliary rotary shafts are coaxially arranged; and first and second auxiliary rotary axes are at the same position.

Further, the present invention is also effective to a case where a hand has two or more rotation axes (the primary rotary axis in the above embodiment) and the direction of the hand can be changed relative to the rotary axes.

Figure 4:
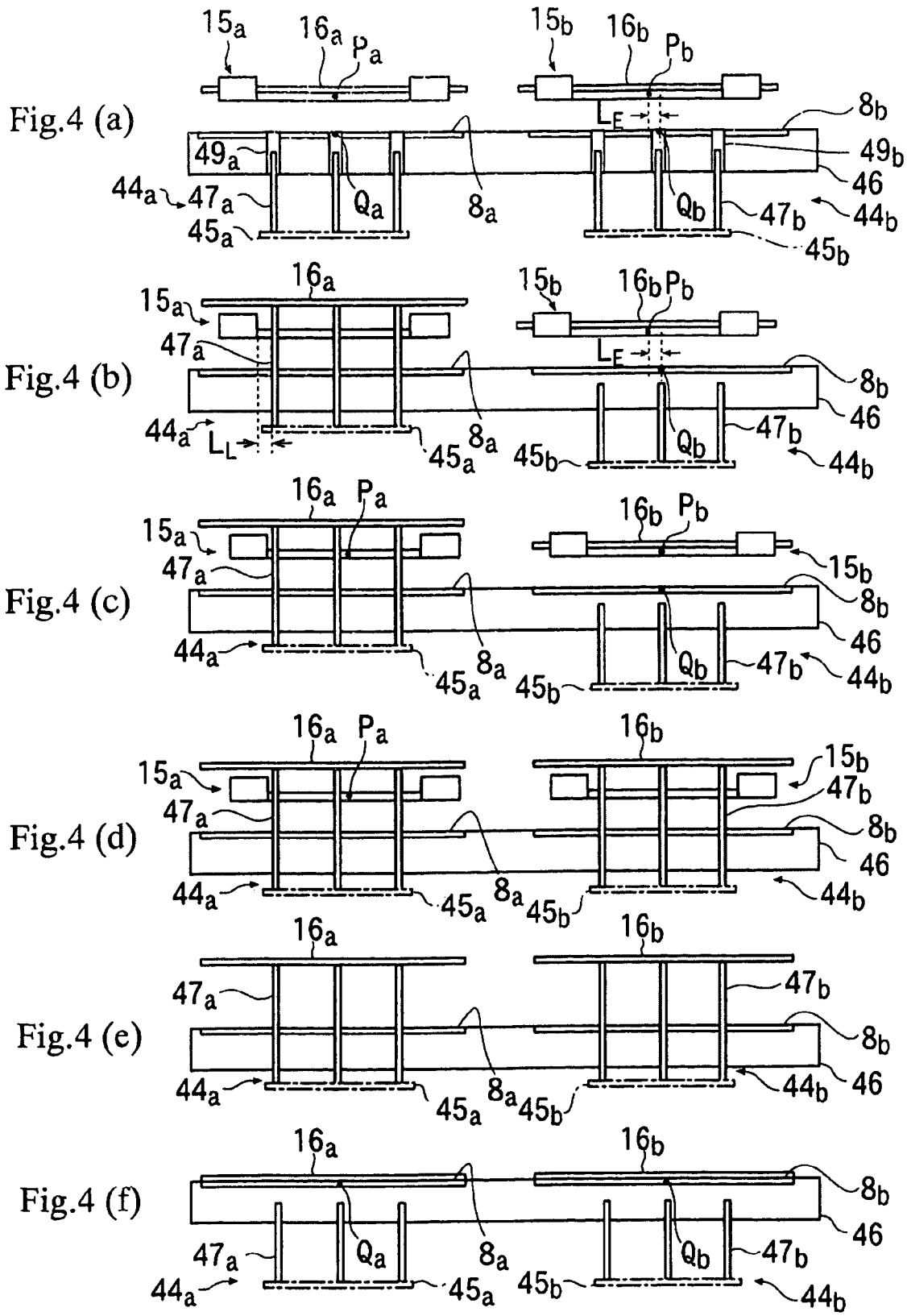
FIGS. 4(a) to (f) are views for illustrating steps of transporting substrates from a hand of the transport robot into a processing chamber.

Although the steps of arranging the substrates in the processing chambers $54_1$ to $54_3$ have been explained above, the above steps explained in the order of (a) to (f) in FIG. 4 are to be reversely performed when the substrates arranged on the first and second processing positions 8a, 8b are carried out from the processing chambers $54_1$ to $54_3$ by the hand 25.

In other words, as shown in FIG. 4(f), when the substrates 16a, 16b are accurately arranged on the first and second processing positions 8a, 8b, both the substrates 16a, 16b on the first and second processing positions 8a, 8b are first lifted up by the first and second supporting members 47a, 47b ((e) of the same figure).

Next, the first and second mounting portions 15a, 15b are inserted into between the substrates 16a, 16b and the first and second processing positions 8a, 8b; and either one of the first and second mounting portions 15a, 15b is located immediately above the corresponding processing position 8a, 8b. Here, the second mounting portion 15b is located immediately above the second processing position 8b ((d) of the same figure).

In this state, the substrate 16b on the second supporting member 47b is placed onto the second mounting portion 15b by descending the second supporting member 47b ((c) of the same figure).

Next, when the first mounting portion 15a is located immediately above the first processing position 8a by moving the hand 25 ((b) of the same figure) and the first supporting member 47a is lowered, the substrate 16a on the first supporting member 47a is placed onto the first mounting portion 15a.

The centers of the substrates 16a, 16b on the first and second mounting portions 15a, 15b are located above the center points Pa, Pb of the first and second mounting portions 15a, 15b, thereby performing accurate transferring.

In the above description, the case where two substrates 16a, 16b are placed on the hand 25 has been explained. However, even when three or more mounting portions are provided and substrates are placed on the respective mounting portions, the substrate may be lifted up from that mounting portion every time the mounting portion is positioned immediately above the processing position one by one.

After the processings are terminated within the processing chambers $54_1$ to $54_3$, the substrates 16a, 16b placed on the first and second mounting portions 15a, 15b as described above are moved into the carrying-in-and-out chamber 52 and transferred to a cassette or the like.

What is claimed is:

1. A method for transporting substrates, comprising the steps of:
   providing a hand of a transport robot with first and second mounting portions; placing the substrates on the first and second mounting portions, respectively; moving the hand into a processing chamber; and placing the substrates on first and second processing positions set out inside the processing chamber,
   wherein the first mounting portion is located above the first processing position by a first movement of the hand, and wherein in a state such that the substrate placed on the first mounting portion is lifted by a first lift-up mechanism, the second mounting portion is located above the second processing position by moving the hand a predetermined distance after the first movement of the hand.

2. The method for transporting the substrates according to claim 1, wherein after the substrate, which is placed on the second mounting portion located above the second processing position, is lifted from the second mounting portion by a second lift-up mechanism, the first and second mounting portions are retracted from above the first and second processing positions, and then the substrates above the first and second processing positions are lowered and arranged on the first and second processing positions.

3. The method for transporting the substrates according to claim 1, wherein the hand is moved by at least one of a rotational movement around one vertical rotary axis and a linear movement along a line extending in a radial direction crossing vertically with the rotary axis.

4. The method for transporting the substrates according to claim 1, wherein the first and second mounting portions are formed in a two-forked shape, the substrate placed on the first mounting portion is mounted on a first supporting member inserted from beneath into a cut portion in the forked shape, and the hand is moved in a state such that the first supporting member is kept inserted into the cut portion.

* * * * *